(12) United States Patent
Hashii et al.

(10) Patent No.: US 7,717,768 B2
(45) Date of Patent: May 18, 2010

(54) WAFER POLISHING APPARATUS AND METHOD FOR POLISHING WAFERS

(75) Inventors: Tomohiro Hashii, Tokyo (JP); Katsuhiko Murayama, Tokyo (JP); Sakae Koyata, Tokyo (JP); Kazushige Takaishi, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/433,701

(22) Filed: May 11, 2006

(65) Prior Publication Data

US 2006/0264157 A1 Nov. 23, 2006

(30) Foreign Application Priority Data

May 18, 2005 (JP) ............................. 2005-145612

(51) Int. Cl.
 *B24B 7/22* (2006.01)
(52) U.S. Cl. ............................ 451/41; 451/57; 451/60
(58) Field of Classification Search .................. 451/60, 451/41, 57, 288, 287, 446, 37
See application file for complete search history.

(56) References Cited

U.S. PATENT DOCUMENTS

| | | | | |
|---|---|---|---|---|
| 2,780,038 | A * | 2/1957 | Laverdisse | 451/60 |
| 5,395,801 | A * | 3/1995 | Doan et al. | 438/692 |
| 5,571,373 | A * | 11/1996 | Krishna et al. | 438/693 |
| 5,700,180 | A | 12/1997 | Sandhu et al. | |
| 5,755,614 | A | 5/1998 | Adams et al. | |
| 6,059,921 | A | 5/2000 | Kato et al. | |
| 6,227,949 | B1 | 5/2001 | Yi et al. | |
| 6,228,771 | B1 * | 5/2001 | Allers | 438/692 |
| 6,368,955 | B1 * | 4/2002 | Easter et al. | 438/633 |
| 6,428,397 | B1 | 8/2002 | Stocker | |
| 6,599,173 | B1 * | 7/2003 | Cruz et al. | 451/41 |
| 6,736,714 | B2 | 5/2004 | Dudovicz | |

FOREIGN PATENT DOCUMENTS

JP 62-188669 * 8/1987 ............. 451/446

(Continued)

OTHER PUBLICATIONS

Korean Office Action for related Korean Application No. KR2006-43370 with English Translation.

(Continued)

*Primary Examiner*—Robert Rose
(74) *Attorney, Agent, or Firm*—Kolisch Hartwell, PC

(57) ABSTRACT

This wafer polishing apparatus includes: a polishing plate having a polishing pad; a carrier plate which is placed facing the polishing pad and which slides and presses wafers against the polishing pad, while rotating in a state of holding the wafers; and an abrasive slurry supply device, wherein the abrasive slurry supply device is able to supply different abrasive slurries, each of the abrasive slurries contains abrasives of which the average grain size is different from those contained in the other abrasive slurries. This method for polishing wafers includes: while supplying an abrasive slurry to a surface of a polishing pad, sliding and pressing wafers against the polishing pad, wherein different abrasive slurries are supplied to the surface of the polishing pad, and each of the abrasive slurries contains abrasives of which the average grain size is different from those contained in the other abrasive slurries.

3 Claims, 6 Drawing Sheets

FOREIGN PATENT DOCUMENTS

| | | | | |
|---|---|---|---|---|
| JP | S64-078758 | 3/1989 | | |
| JP | 04-129664 | 4/1992 | | |
| JP | 5-138529 | * 6/1993 | ................ | 451/294 |
| JP | 05-162065 | 6/1993 | | |
| JP | 10-015808 | 1/1998 | | |
| JP | 10-180616 | 7/1998 | | |
| JP | 10-242090 | 9/1998 | | |
| KR | 1996-33655 | 10/1996 | | |
| KR | 2000-21813 | 4/2000 | | |
| TW | 365561 | 8/1999 | | |
| TW | 423043 | 2/2001 | | |
| TW | 445193 | 7/2001 | | |

OTHER PUBLICATIONS

Korean Office Action issued on Sep. 28, 2007 in counterpart Korean Application No. 2006-43370.

European Office Action for related European Application No. 06009972.8, issued Jul. 16, 2007.

Taiwan Intellectual Property Office, "Office Action and Search Report" for TW 095117119, issued May 20, 2009 (5 pages). Includes an English translation of the Search Report.

Patent Office of Japan, "Notice of Reasons for Rejection" for Japanese application No. 2005-145612; mailing date Oct. 20, 2009; 5 pages.

* cited by examiner

FIG. 3
(a) 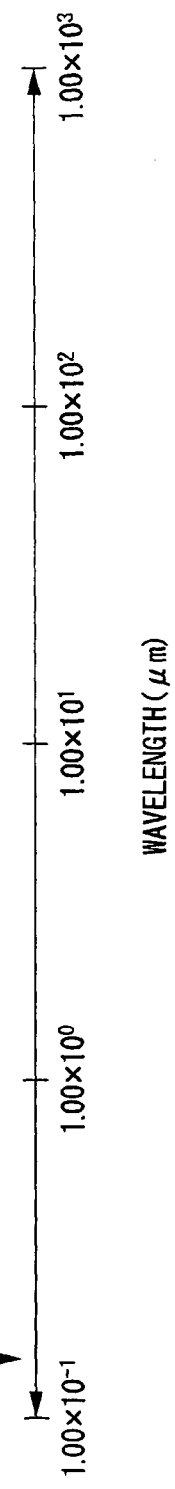
(b) 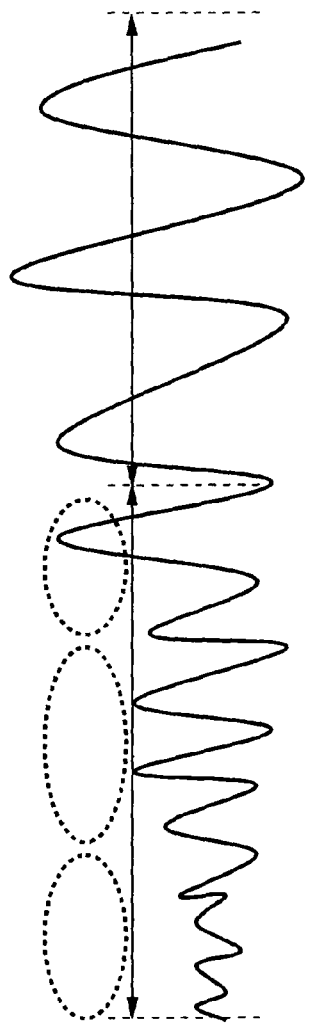

WAFER POLISHING APPARATUS AND METHOD FOR POLISHING WAFERS

BACKGROUND OF THE INVENTION

1. Field of the Invention

The present invention relates to an apparatus for polishing wafers and a method for polishing wafers which are employed to polish surfaces of wafers or the like that forms integrated circuits.

This application claims priority from Japanese Patent Application No. 2005-145612, filed May 18, 2005, the content of which is incorporated herein by reference.

2. Background Art

Generally, a silicon wafer of which the surface has being etched is subjected to a polishing step in which the surface is polished. A conventional polishing includes a first polishing step in which coarse bumps are smoothed away in the surface of the wafer using a wafer polishing apparatus provided with a hard polishing pad and a second polishing step in which eliminates minute pits are eliminated in the surface of the wafer using a wafer polishing apparatus provided with a soft polishing pad. Thereby, the surface of the wafer is finished to a smooth mirror surface having no strain. Since the type of the polishing pad used in the first polishing step is different from that of the polishing pad used in the second polishing step, a wafer polishing apparatus is used exclusively for each of the first polishing step and the second polishing step.

FIG. 7 is a view showing the schematic structure of a wafer polishing apparatus used in the conventional polishing method. In FIG. 7, a figure (a) is a plan view and a figure (b) is a side view thereof (see, for example, Patent Document 1).

A conventional wafer polishing apparatus includes a rotating disk 31, a polishing pad 32 adhered to substantially the entire surface of the rotating disk 31, a plurality of rotating holders 33 provided above the rotating disk 31, and a wafer mounting plate 35 fixed to each of the rotating holders 33. The rotating holders 33 are constructed so as to be able to perform a rotational movement as well as a vertical movement using a shaft 34. A plurality of wafers 36 are mounted on the wafer mounting plates 35. The symbol 37 in the drawings is an injection pipe and if needed, the wafer may be polished while an abrasive slurry 38 such as a cerium oxide based slurry is supplied from the injection pipe 37.

However, in the conventional polishing method, because the wafer polishing apparatus and the polishing pad are used exclusively for each of the first polishing step and the second polishing step, equipments and polishing materials are needed for each of the steps in order to polish the wafers. As a result, the problem arises in which production costs become high. Moreover, after the first polishing step is finished, the wafer polishing apparatus is changed and then the second polishing step is started. Therefore, the problem arises in which the polishing process becomes complicated and it takes a long time to polish the wafers.

The present invention was conceived in view of the above described circumstances and it is an object thereof to provide an apparatus for polishing wafers and a method for polishing wafers which enable to reduce equipments and polishing materials required for polishing wafers, and which can realize simplification of the wafer polishing process and reduction in the polishing time.

(Patent Document 1) Japanese Patent Application, First Publication No. S64-78758

SUMMARY OF THE INVENTION

As a result of intense investigations and experiments so as to solve the above described problems, the present inventors discovered that, as shown in FIG. 1 of the power spectral density (PSD) analysis results, in a surface roughness components of a wafer prior to the polishing, long wavelength components (for example, those of which the wavelength exceeds 10 μm) and short wavelength components (for example, those of which the wavelength is 10 μm or less) are included.

Moreover, it was discovered that in the case in which an abrasive slurry containing abrasives having an average grain diameter of 60 nm to 140 nm is used when polishing surfaces of wafers, as shown by the curved line A in FIG. 2 (a), the long wavelength components can be removed in a short amount of time (i.e., they have a high rate of convergence); however, a rate of convergence of the short wavelength components is low. Also, it was discovered that in the case in which an abrasive slurry containing abrasives having an average grain diameter of 50 nm to 70 nm is used when polishing surfaces of wafers, as shown by the curved line B in FIG. 2 (a), the short wavelength components can be removed in a short amount of time (i.e., they have a high rate of convergence); however, a rate of convergence of the long wavelength components is low.

Note that the rate of convergence is an inverse number of the time it takes until the surface of the wafer surface becomes mirror finished. The higher the rate of convergence, the shorter the time it takes until the surface becomes mirror finished, and the better the polishing efficiency.

Furthermore, the case was examined in which during polishing, the abrasive slurry which is being supplied to a surface of a polishing pad is changed to other abrasive slurry having abrasives of which the average grain diameter is different from that of the abrasive slurry that is being supplied. For example, the surfaces of the wafers are polished while a first abrasive slurry is supplied which contains abrasives having an average grain diameter of 60 nm to 140 nm. Next, the first abrasive slurry is changed to a second abrasive slurry which contains abrasives having an average grain diameter of 50 nm to 70 nm, and then the surfaces of the wafers are polished while this second abrasive slurry is supplied. Note that the average grain diameter of the abrasives in the first abrasive slurry is larger than that of the abrasives in the second abrasive slurry. In accordance with the examination of the case, it was discovered that the results described below were obtained, which led to the attainment of the present invention.

Referring to the curved line C in FIG. 3 (a) showing the rate of convergence in the above-described case, for the long wavelength components, the rate of convergence is slightly lower than that in the conventional case in which a hard polishing pad having a hardness of 96 is used (shown by the curved line D in FIG. 3 (a)). However, the rate of convergence is considerably higher than that in the conventional case in which a soft polishing pad having a hardness of 70 is used (shown by the curved line E in FIG. 3 (a)). For the short wavelength components, the rate of convergence is slightly lower than that in the conventional case using the soft polishing pad shown by the curved line E in FIG. 3 (a); however, the rate of convergence is considerably higher than that in the conventional case using the hard polishing pad shown by the curved line D in FIG. 3 (a).

Furthermore, referring to the curved line C in FIG. 2 (a) showing the rate of convergence in the above-described case, for the long wavelength components, the rate of convergence is slightly lower than that in the case in which an abrasive slurry that contains abrasives having an average grain diameter of 60 nm to 140 nm is used (shown by the curved line A in FIG. 2 (a)). However, the rate of convergence is considerably higher than that in the case in which an abrasive slurry that contains a polishing agent having an average grain diameter of 50 nm to 70 nm is used (shown by the curved line B in FIG. 2 (a)). For the short wavelength components, the rate of convergence is slightly lower than that shown by the curved line B in FIG. 2 (a); however, the rate of convergence is considerably higher than that shown by the curved line A in FIG. 2 (a).

Accordingly, using a single wafer polishing apparatus and without changing the wafer polishing apparatus or polishing pad, it is possible to efficiently remove both long wavelength components and short wavelength components in the surface roughness components of wafers and to realize smooth mirror-finished surfaces having no strain. Note that FIGS. 2 (b) and 3 (b) show graphs that show a relationship between roughness components in a surface of a wafer and wavelength.

The wafer polishing apparatus of the present invention includes: a polishing plate having a polishing pad which is provided on the surface thereof; a carrier plate which is placed facing the polishing pad and which slides and presses wafers against the polishing pad, while rotating in a state of holding the wafers; and an abrasive slurry supply device which supplies abrasive slurries including abrasives to the surface of the polishing pad, wherein the abrasive slurry supply device is able to supply different abrasive slurries, each of the abrasive slurries contains abrasives of which the average grain size is different from those contained in the other abrasive slurries.

In the wafer polishing apparatus, the abrasive slurry supply device may be able to supply at least one of two or more abrasive slurries, and may be able to change the abrasive slurry to be supplied.

The abrasive slurry supply device may include: two or more abrasive slurry supply sources; supply pipes connected to the abrasive slurry supply sources; and a switching valve provided in the supply pipes.

The two or more abrasive slurries may include a first abrasive slurry which contains abrasives having an average grain diameter of 60 nm to 140 nm and a second abrasive slurry which contains abrasives having an average grain diameter of 50 nm to 70 nm, and the average grain diameter of the abrasives contained in the first abrasive slurry may be larger than the average grain diameter of the abrasives contained in the second abrasive slurry.

The method for polishing wafers of the present invention includes: while supplying an abrasive slurry containing abrasives to a surface of a polishing pad, sliding and pressing wafers against the polishing pad, so as to polish surfaces of the wafers, wherein different abrasive slurries are supplied to the surface of the polishing pad, and each of the abrasive slurries contains abrasives of which the average grain size is different from those contained in the other abrasive slurries.

In the method for polishing wafers, during the polishing, the abrasive slurry which is being supplied may be changed to other abrasive slurry that contains abrasives having an average grain size different from that of the abrasives contained in the abrasive slurry which is being supplied.

The surface of the wafers may be polished while a first abrasive slurry which contains abrasives having an average grain diameter of 60 nm to 140 nm is supplied to the surface of the polishing pad, and then the abrasive slurry to be supplied may be changed from the first abrasive slurry to a second abrasive slurry which contains abrasives having an average grain diameter of 50 nm to 70 nm, and the surfaces of the wafers may be polished while the second abrasive slurry is supplied to the surface of the polishing pad.

By using the wafer polishing apparatus of the present invention, the following polishing process can be conducted. Wafers are polished while at least one of two or more different abrasive slurries is supplied. Next, the abrasive slurry which is being supplied is changed to other abrasive slurry, and then the wafer is polished while the other abrasive slurry is supplied. For example, each of an abrasive slurry that contains abrasives having a large grain diameter and an abrasive slurry that contains abrasives having a small grain diameter can be supplied at a predetermined moment in the polishing process. As a result, it is possible to efficiently remove both of coarse bumps and minute pits in the surface of the wafer; thereby, the surface of the wafer can be finished to a smooth mirror surface having no strain. Namely, by polishing wafers using the wafer polishing apparatus of the present invention, it is possible to remove both of coarse bumps and minute pits the surfaces of the wafers using a single wafer polishing apparatus. Therefore, unlike the conventional situation, it is not necessary to use different wafer polishing apparatuses and polishing pads each of which is used exclusively for removing coarse bumps or for eliminating minute pits. Accordingly, it is possible to reduce equipments and polishing materials required for polishing wafers. Moreover, the wafer polishing process is simplified and the polishing time is shortened; thereby, the wafer can be polished efficiently.

Also, using the switching valve, it is possible to change the abrasive slurries quickly. Therefore, during changing the abrasive slurries, it is needless to interrupt the polishing. The abrasive slurries can be changed while maintaining the polishing operation.

In accordance with the method for polishing wafers of the present invention, each of an abrasive slurry that contains abrasives having a large grain diameter and an abrasive slurry that contains abrasives having a small grain diameter can be supplied at a predetermined moment in the polishing process. As a result, it is possible to efficiently remove both of coarse bumps and minute pits in the surface of the wafer; thereby, the surface of the wafer can be finished to a smooth mirror surface having no strain by a single polishing process.

During the polishing, it is possible to change the abrasive slurry which is being supplied to other abrasive slurry which contains abrasives having a different average grain diameter using the single wafer polishing apparatus. Therefore, it is possible to remove both of coarse bumps and minute pits in the surface of the wafer using the single wafer polishing apparatus. As a result, unlike the conventional situation, it is not necessary to change wafer polishing apparatuses and a polishing pads between the operation for removing coarse bumps and the operation for eliminating minute pits. Accordingly, it is possible to reduce equipments and polishing materials required for polishing wafers. Moreover, the wafer polishing process is simplified, the polishing time is shortened; thereby, the wafer can be polished efficiently.

Furthermore, by using abrasive slurries selectively in accordance with the change of roughness components from the initial stage to the end stage of the polishing, it is possible to reduce equipments and polishing materials required for polishing wafers. Moreover, the wafer polishing process can be simplified and the polishing time can be shortened.

BRIEF DESCRIPTION OF THE DRAWINGS

FIG. 3 (a) is a graph showing relationships between rates of convergence for roughness components and wavelength of the roughness components in the conventional examples in which polishing pads having various hardnesses are used and one example of the present invention, and FIG. 3 (b) is a graph showing a relationship between roughness components in a surface of a wafer and wavelength.

PREFERRED EMBODIMENTS

Embodiments of the wafer polishing apparatus of the present invention are described below in conjunction with the attached figures.

Figure 4:
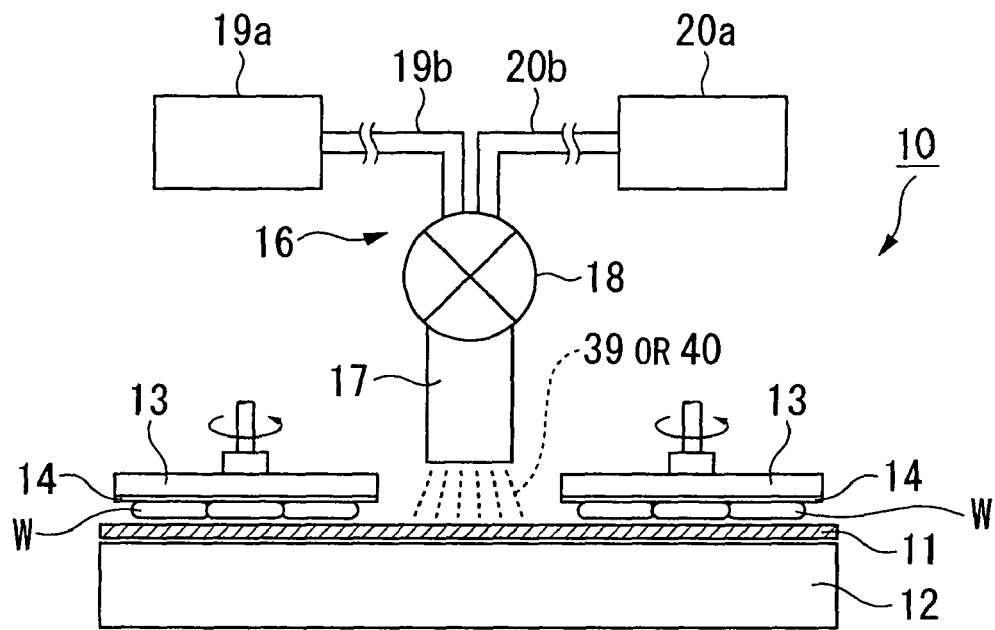
FIG. 4 is an enlarged cross-sectional view showing principal portions of a wafer polishing apparatus of an embodiment of the present invention.
Figure 5:
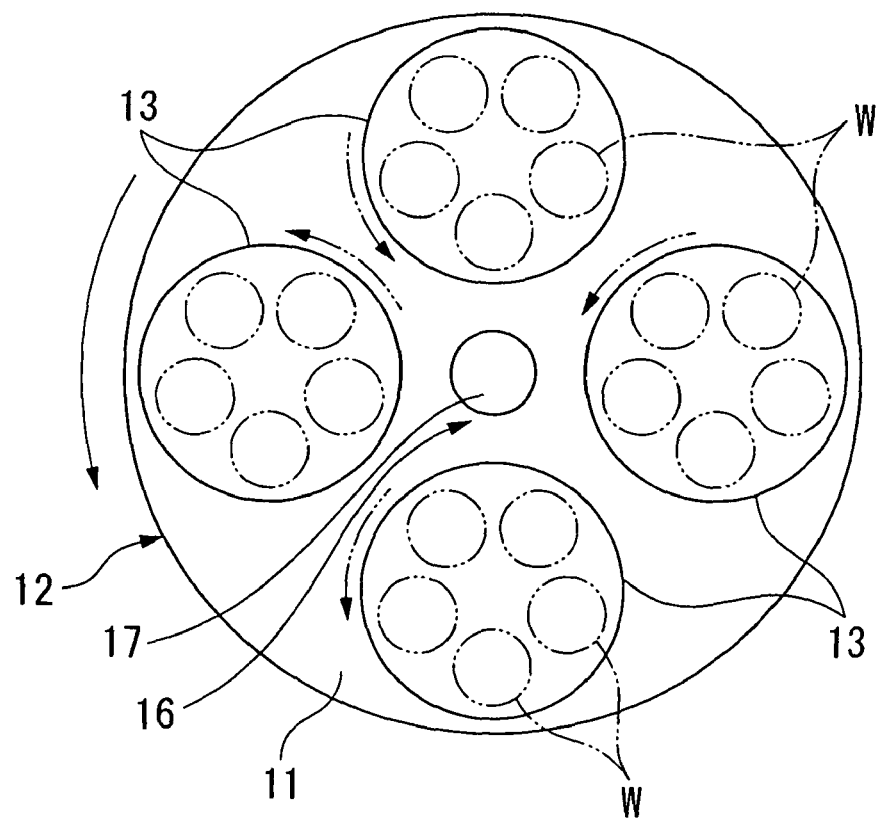
FIG. 5 is a plan view showing a polishing plate and carrier plates provided in the wafer polishing apparatus shown in FIG. 4.

FIG. 4 is an enlarged cross-sectional view showing principal portions of a wafer polishing apparatus of the present embodiment. FIG. 5 is a plan view showing a polishing plate and carrier plates provided in the wafer polishing apparatus shown in FIG. 4.

The wafer polishing apparatus 10 of the present embodiment includes a polishing plate 12 on which surface is provided a polishing pad 11, a plurality (four in the example shown in the drawing) of polishing heads 13 which are placed above the polishing plate 12, and an abrasive slurry supply device 16 which supplies abrasive slurries to the surface of a polishing pad 11.

The polishing heads 13 are each provided such that it can rotate around an axis. A carrier plate 14 is provided on a surface of each of the polishing heads 13 which faces the polishing plate 12. When the polishing head 13 is rotated, the carrier plate 14 provided on the polishing head 13 also rotates around the axis. A plurality of silicon wafers W (five wafers in the example shown in the drawing) are held at predetermined intervals (angular intervals of 72 degrees in the example shown in the drawings) with a center portion of the polishing head 13 as a center. The silicon wafers W are, for example, wafers which have been sliced, wrapped and etched and which further need to be subjected to a polishing step for polishing the surfaces to be mirror surfaces. The dimensions of these silicon wafers W are preferably, for example, a diameter of 300 mm and a thickness of 750 mm.

The polishing pad 11 includes a urethane foam, a non-woven fabric, or a suede.

The abrasive slurry supply apparatus 16 has a first abrasive slurry supply source 19a and a second abrasive slurry supply source 20a, and these are filled respectively with a first abrasive slurry 39 and a second abrasive slurry 40. A first supply pipe 19b is connected to the first abrasive slurry supply source 19a, and a second supply pipe 20b is connected to the second abrasive slurry supply source 20a. The first supply pipe 19b and the second supply pipe 20b are connected to one end of a single supply pipe 17 via a valve 18 (i.e., a switching device). The other end (i.e., a supply aperture) of the supply pipe 17 opens above a substantially central portion of the polishing pad 11.

The first abrasive slurry 39 is supplied from the first abrasive slurry supply source 19a to the valve 18 through the first supply pipe 19b. The second abrasive slurry 40 is supplied from the second abrasive slurry supply source 20a to the valve 18 through the second supply pipe 20b. It is possible to select and supply only one of the first abrasive slurry 39 and the second abrasive slurry 40 to the supply pipe 17 using the valve 18. The supply amount of each of the abrasive slurries can also be adjusted. As a result, by operating the valve 18, either of the first abrasive slurry 39 or the second abrasive slurry 40 can be supplied to the surface of the polishing pad 11. Namely, the abrasive slurry supply apparatus 16 enables to change the abrasive slurry. For example, the abrasive slurry which is being supplied can be changed to other abrasive slurry which contains abrasives having a different average grain diameter.

The first abrasive slurry 39 contains abrasives having a average grain diameter of 60 to 140 nm. The second abrasive slurry 40 contains abrasives having an average grain diameter of 50 to 70 nm. Examples of the abrasives include cerium oxide particles.

As solvents that can be used to disperse the abrasives having an average grain diameter of 60 to 140 nm and the abrasives having an average grain diameter of 50 to 70 nm, for example, an alkaline aqueous solution is raised.

It is preferable that the average grain diameter of the abrasives in the first abrasive slurry is greater than that of the abrasives in the second abrasive slurry.

The polishing plate 12 is provided such that it can rotate around an axis different from the rotation axes of the polishing heads 13. The rotation directions of the polishing plate 12 and the respective polishing heads 13 are the same direction. Note that the rotation system of the polishing heads 13 is not limited to that of the present embodiment.

The method for mounting the silicon wafers W on the carrier plates 14 may be a wax adhesion method or a waxless mounting method.

Next, a method for polishing the silicon wafers W using this polishing apparatus 10 will be described.

In accordance with roughness components which change as the polishing proceeds, polishing slurries are selectively used. Specifically, changes of the roughness components with time are measured and determined in advance. And then, based on the measurement results, the polishing slurries are selectively used at each stage of the polishing procedure such that majority of the roughness component can be efficiently removed.

Figure 1:
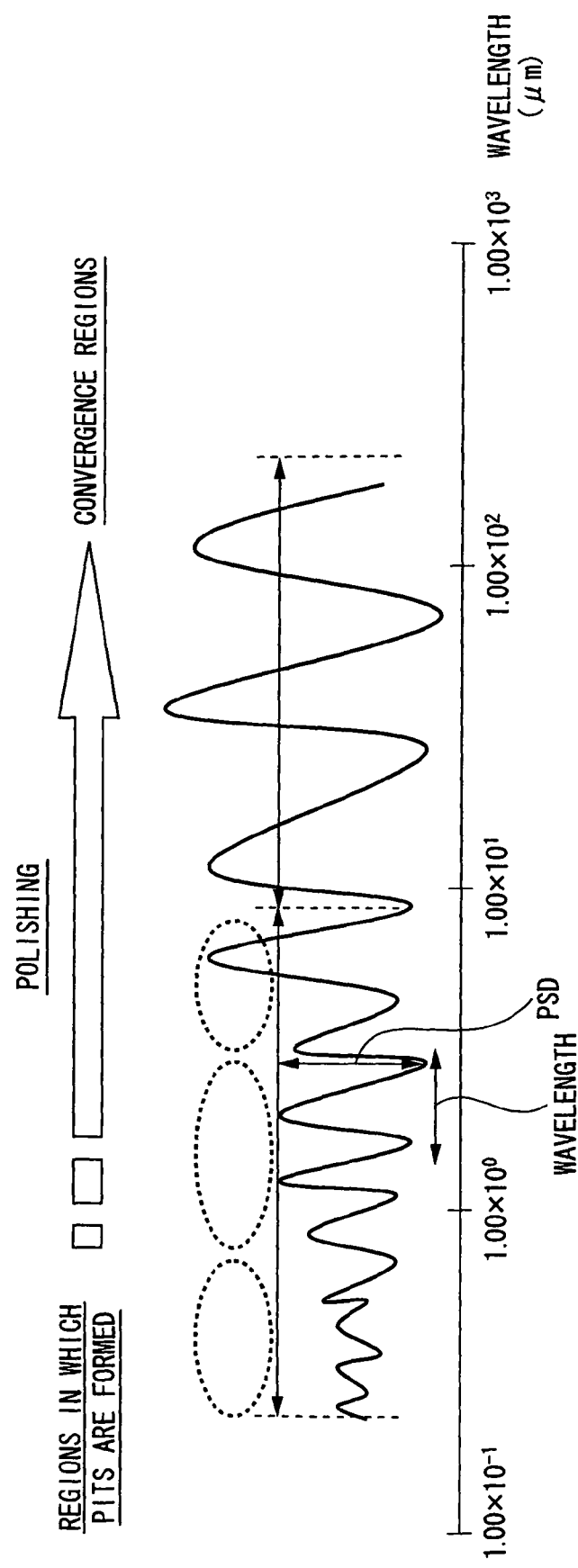
FIG. 1 is a graph showing PSD analysis results of the roughness of a surface of a wafer prior to polishing.
Figure 2:
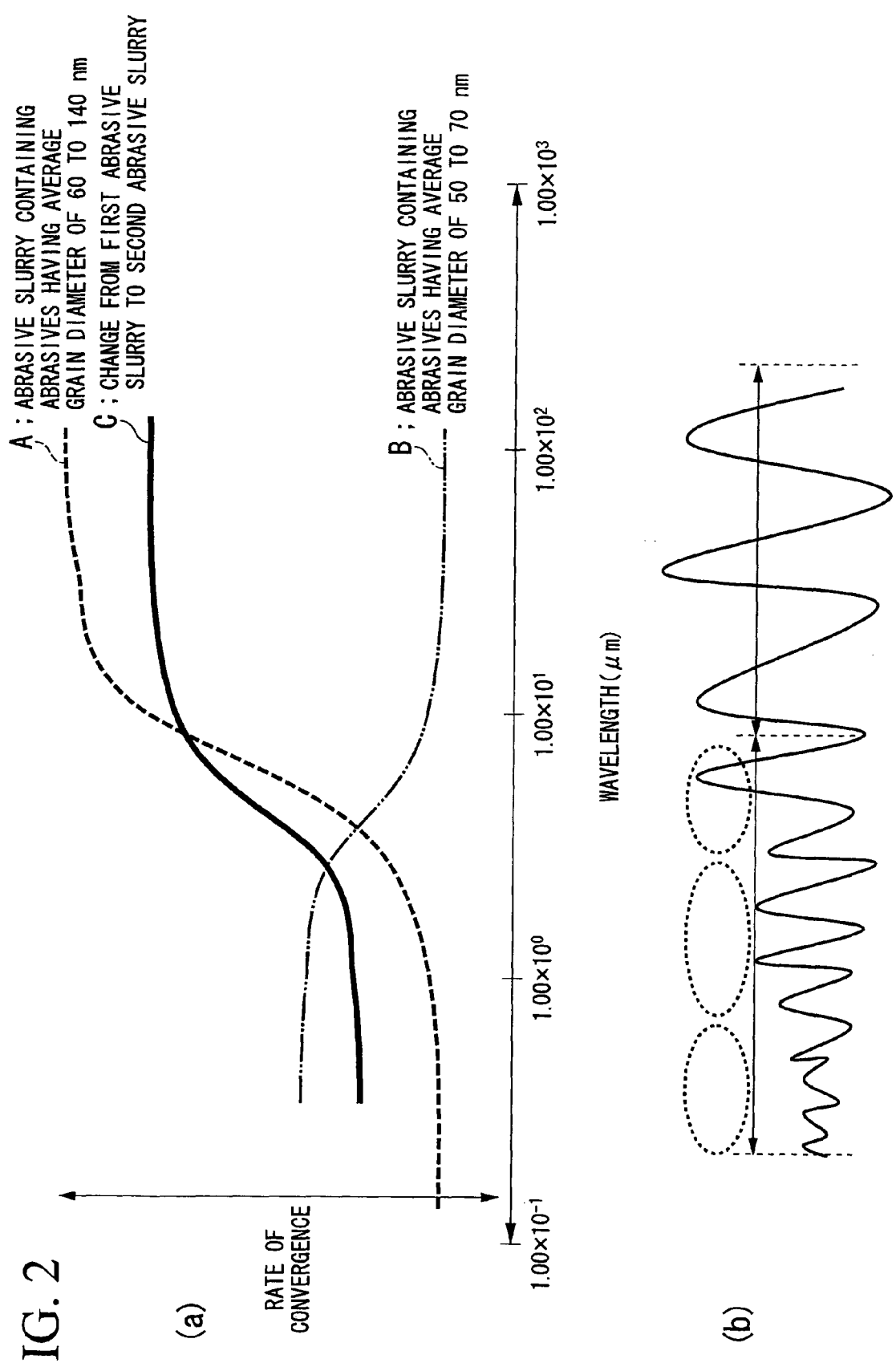
FIG. 2 (a) is a graph showing relationships between rates of convergence for roughness components and wavelength of the roughness components in the examples in which various abrasive slurries are used and one example of the present invention, and FIG. 2 (b) is a graph showing a relationship between roughness components in a surface of a wafer and wavelength.

As shown in FIG. 1, long wavelength components and short wavelength components are included in the surface roughness components of the wafer. In a first half of the polishing procedure, the long wavelength components have a tendency to converge and to be mirror polished. A portion of the short wavelength components have a tendency not to converge (not to be mirror polished) and to remain as pits even in a second half of the polishing procedure. Therefore, the roughness components have a tendency in which the long wavelength components first converge and the short wavelength components remain in the second half of the polishing procedure.

In accordance with this change of the roughness components, in this embodiment, a first polishing slurry (average grain diameter of abrasives is 60 nm to 140 nm) by which the long wavelength components can be efficiently removed, is used in the first half of the polishing procedure, and then a second polishing slurry (average grain diameter of abrasives is 50 nm to 70 nm) by which the short wavelength components can be efficiently removed, is used in the second half of the polishing procedure.

As is shown in FIGS. 4 and 5, firstly, a plurality of silicon wafers W (five wafers in the example shown in the drawing) are adhered using wax to each of the carrier plates 14 with a predetermined spacing (angular interval of 72 degrees in the example shown in the drawings) between each other. In addition, each of the carrier plates 14 is adhered to a bottom surface of the corresponding polishing head 13.

Next, by lowering each of the polishing heads 13, the silicon wafers W are each pressed against a polishing working surface of the polishing head 11 which is provided on the polishing plate 12. While maintaining this state, in the first half of the polishing procedure, the first abrasive slurry 30 is supplied from the abrasive slurry supply device 16 onto the polishing pad 11. The polishing plate 12 is rotated in the direction of the solid arrow in FIG. 5, and at the same time, each of the polishing heads 13 is rotated in the direction of the chain double-dashed arrow in FIG. 5; thereby, each of the silicon wafers W is slid and pressed against the polishing pad 11 and is consequently polished. As a result, in the first half of the polishing procedure, long wavelength roughness components can be efficiently removed.

Next, in the second half of the polishing procedure, while maintaining a state in which each of the silicon wafers W is pressed against the polishing working surface of the polishing pad 11, the valve 18 is operated and the abrasive slurry that is supplied from the abrasive slurry supply apparatus 16 onto the polishing pad 11 is changed to the second abrasive slurry 40. While supplying the second abrasive slurry 40, the polishing plate 12 is rotated in the direction of the solid arrow in FIG. 5. At the same time, each of the polishing heads 13 is rotated in the direction of the chain double-dashed arrow in FIG. 5; thereby, each of the silicon wafers W is slid and pressed against the polishing pad 11 and is consequently polished. As a result, in the second half of the polishing procedure, short wavelength roughness components can be efficiently removed.

By employing the above described polishing procedure, the surface (i.e., the polished surface) of each silicon wafer W is polished.

The wafer polishing apparatus 10 of the present embodiment has the abrasive slurry supply apparatus 16 which supplies abrasive slurries to the surface of the polishing pad 11, and the abrasive slurry supply apparatus 16 is able to change the abrasive slurry that is supplied. As a result, it is possible to select the optimum abrasive slurry from a plurality of (i.e., two or more) abrasive slurries in accordance with the roughness component that changes from the initial stages to the end stages of the polishing. Specifically, the abrasive slurry which is being supplied can be changed to other abrasive slurry which contains abrasives having a different average grain diameter. Consequently, when the surfaces of the wafers W are polished using this wafer polishing apparatus 10, it is possible to efficiently remove both of coarse bumps and minute pits in the surfaces of the wafers; thereby, the surfaces of the wafers can be finished to smooth mirror surface having no strain. Namely, when polishing using the wafer polishing apparatus 10 of the present embodiment, it is possible to remove both of the coarse bumps and the minute pits in the surfaces of the wafers (i.e., both of the long wavelength roughness components and the short wavelength roughness components) using a single wafer polishing apparatus. Because of this, unlike the conventional situation, it is not necessary to use different wafer polishing apparatuses and polishing pads each of which is used exclusively for eliminating minute pits or for removing coarse bumps. Accordingly, it is possible to reduce the equipments and polishing materials required for polishing wafers. Moreover, the wafer polishing process is simplified, the polishing time is shortened; thereby, the wafer can be polished efficiently.

Furthermore, in the method for polishing wafers of the present embodiment, while an abrasive slurry is supplied to the surface of the polishing pad 11, the polishing pad 11 is rotated, and at the same time, the rotating wafers are slid and pressed; thereby, the surfaces of the wafers are polished. During this polishing, the abrasive slurry which is being supplied to the surface of the polishing pad 11 is changed to an abrasive slurry that contains abrasives having a different average grain diameter. Namely, considering the roughness components which change between the initial stages and the end stages of polishing, among plurality of abrasive slurries, one is selectively used by which roughness components can be removed most effectively. As a result, it is possible to remove both of coarse bumps and minute pits in the surfaces of the wafers using a single wafer polishing apparatus. Because of this, unlike the conventional situation, it is not necessary to use different polishing pads each of which is used exclusively for eliminating minute pits or for removing coarse bumps in the surfaces of the wafers. Accordingly, it is possible to reduce the equipments and polishing materials required for polishing wafers. Moreover, the wafer polishing process is simplified, the polishing time is shortened; thereby, the wafer can be polished efficiently.

Here, in the present embodiment, the first abrasive slurry 39 and the second abrasive slurry 40 are used, however, three or more types of abrasive slurries may be used. Two or more abrasive slurries may be mixed together and then be supplied to the polishing pad 11. For example, in the case when two or more abrasive slurries each of which contains abrasives having a average grain diameter different from those of others are mixed together and then are supplied to the polishing pad 11, an adjustment of the mixing ratio thereof makes it possible to adjust the average grain diameter and the grain size distribution of the abrasives in the supplied abrasive slurry Therefore, by adjusting the mixing ratio in accordance with the roughness components which change from the initial stages to the end stages in the polishing procedure, it is possible to efficiently polish a wafer.

Each of the first supply pipe 19b and the second supply pipe 20b may be provided with a flow control valve, and the change of the abrasive slurry may be conducted by adjusting flow rates of the abrasive slurries using the flow control valves.

EXAMPLE

Specific examples are given below.

Example

The wafer polishing apparatus 10 of the present embodiment was used in which the abrasive slurry supply apparatus 16 was provided. As is shown in the embodiment, during the polishing process, the slurry which was supplied to the surface of the polishing pad 11 was changed from a first abrasive slurry which contained the abrasives having a average grain diameter of 60 nm to 140 nm to a second abrasive slurry which contained the abrasives having a average grain diameter of 50 nm to 70 nm, and the surfaces of the silicon wafers W were polished.

Comparative Example

In the same way as in a conventional method, in a first polishing step, coarse bumps in the surfaces of the wafers were removed using a hard polishing pad. Next, in a second polishing step, minute pits were eliminated using a soft polishing pad. In the second polishing step, a wafer polishing apparatus and the polishing pad were used which were different from those used in the first polishing step.

Figure 6:
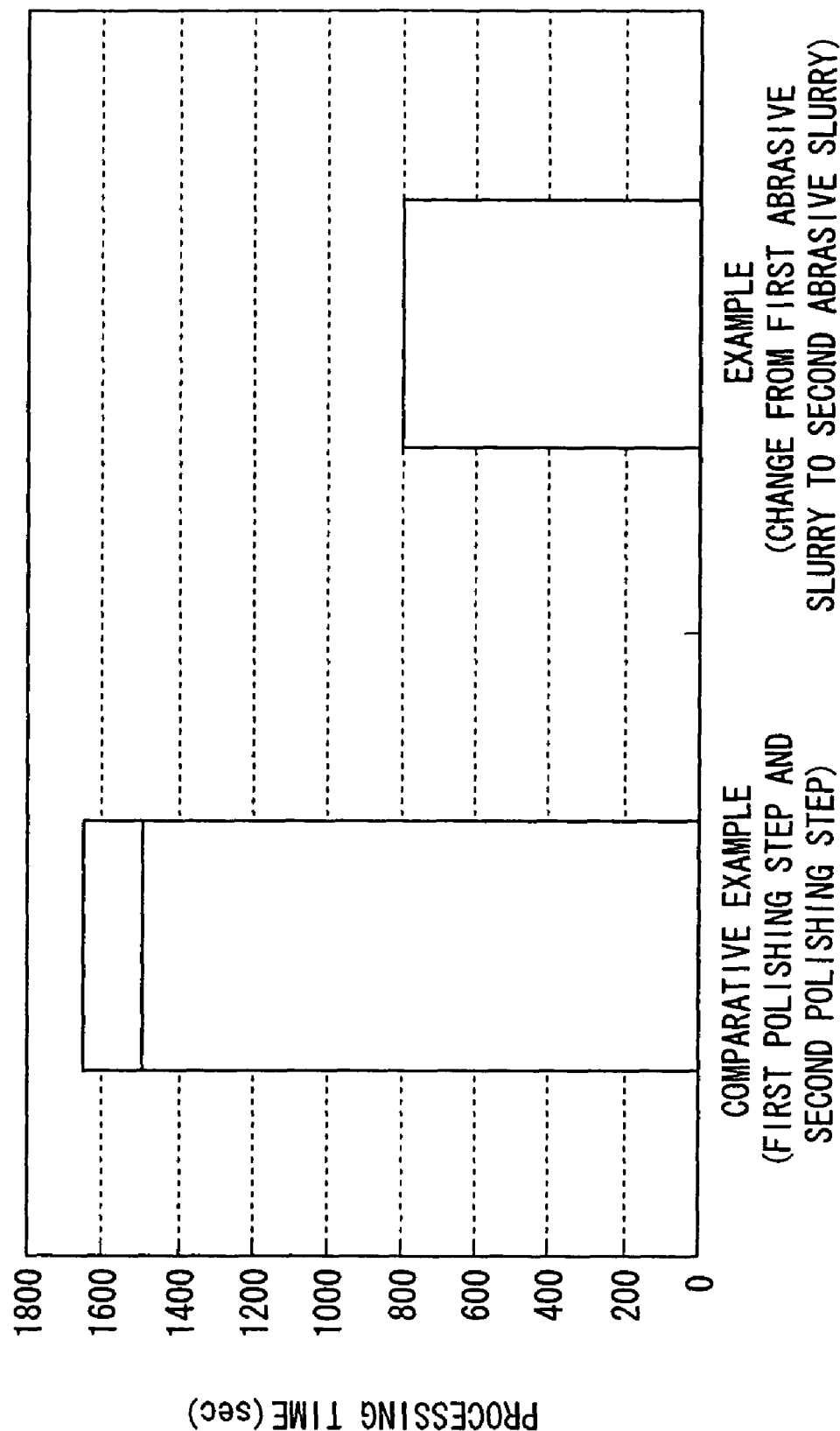
FIG. 6 is a graph showing polishing times for Example and for Comparative Example.
Figure 7:
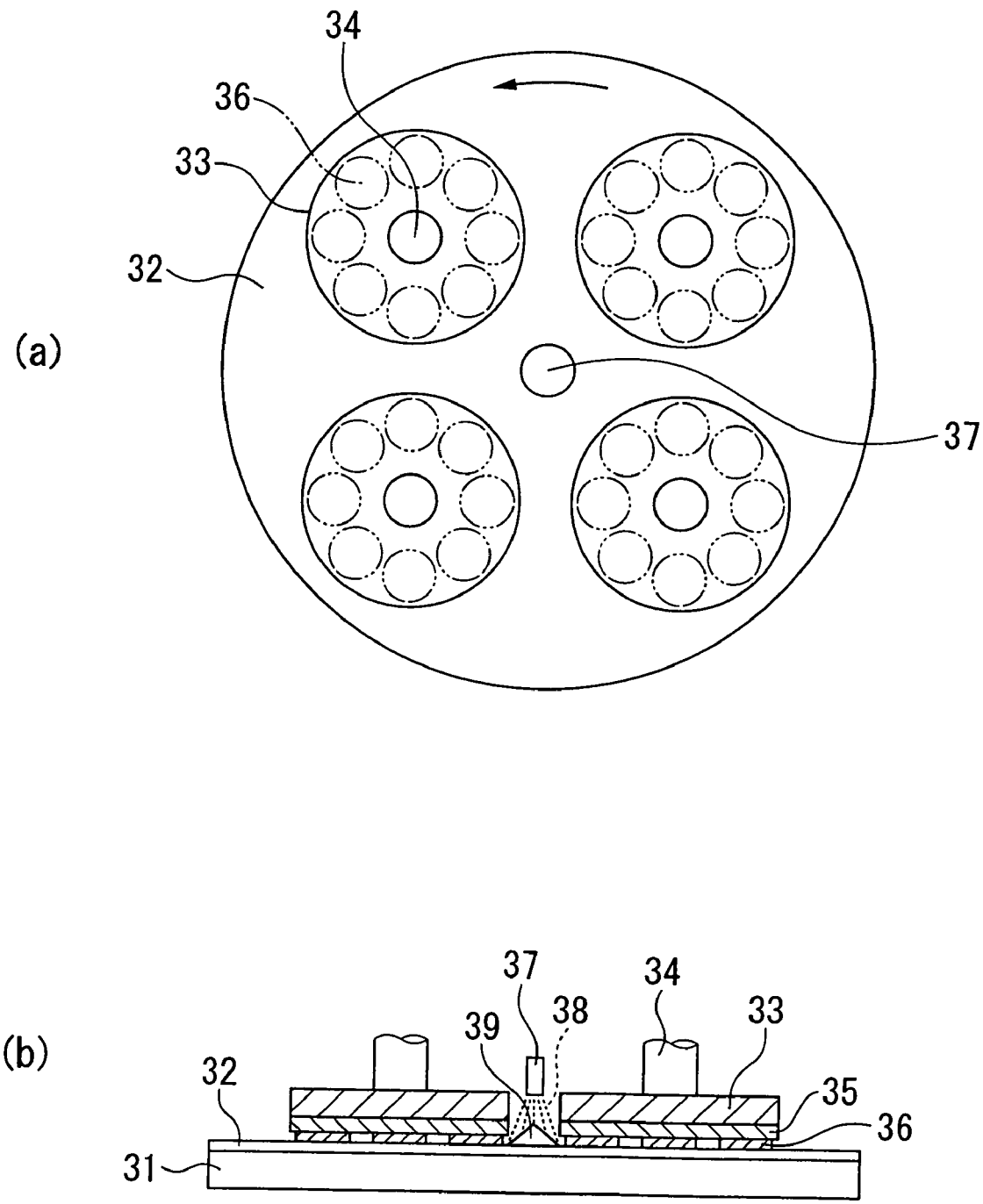
FIG. 7(a) is a plan view showing a schematic structure of a conventional wafer polishing apparatus, and FIG. 7 (b) is a side view thereof.

As is shown in FIG. 6, the processing time in the Comparative Example was approximately 1650 seconds. In contrast, the processing time in the Example was approximately 800 seconds. In this manner, in the Example, it was found that the time required for the wafer polishing process was able to be shortened to a half or less of the time required in the Comparative Example, and that the wafer could be efficiently polished.

In accordance with the present embodiment, by selecting and supplying the optimum abrasive slurry from a plurality of abrasive slurries in accordance with the roughness component that changes from the initial stages to the end stages of the polishing, it is possible to perform processes for removing the respective roughness components on a single axis (using a single equipment and a single polishing pad). As a result, the time required for the polishing process can be cut in half, the equipment and polishing pads can be reduced, and costs can be lowered.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A method for polishing wafers including a plurality of polishing stages using abrasive slurries, the method comprising:

measuring surface roughness of wafers by power spectral density analysis;

based on the measured surface roughness, selecting a first abrasive slurry and a second abrasive slurry different from the first abrasive slurry in grain size such that long wavelength components and short wavelength components of the surface roughness can be efficiently removed;

mixing the first abrasive slurry and the second abrasive slurry so as to make a mixed abrasive slurry;

polishing the surfaces of the wafers while supplying the mixed abrasive slurry to the surface of the polishing pad; and adjusting a mixing ratio in accordance with the roughness components which change from an initial stage to an end stage in the polishing.

2. The method for polishing wafers according to claim 1, wherein the first abrasive slurry is an abrasive slurry by which the long wavelength components of the surface roughness can be efficiently removed, and the second abrasive slurry is an abrasive slurry by which the short wavelength components of the surface roughness-can be efficiently removed.

3. The method for polishing wafers according to claim 1, wherein the first abrasive slurry contains abrasives having an average grain diameter of 60 nm to 140 nm, and the second abrasive slurry contains abrasives having an average grain diameter of 50 nm to 70 nm.

\* \* \* \* \*